United States Patent
Lin et al.

(10) Patent No.: US 8,755,054 B2
(45) Date of Patent: Jun. 17, 2014

(54) METHOD OF MEASURING SURFACE STRUCTURE OF DISPLAY DEVICE

(71) Applicant: Chunghwa Picture Tubes, Ltd., Taoyuan (TW)

(72) Inventors: Chih-Wei Lin, Taichung (TW); Min-Cheng Wang, Taipei County (TW); Yung-Cheng Chen, Taoyuan County (TW); Hung-Min Liu, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 14/061,763

(22) Filed: Oct. 24, 2013

(65) Prior Publication Data

US 2014/0049785 A1 Feb. 20, 2014

Related U.S. Application Data

(62) Division of application No. 12/779,915, filed on May 13, 2010, now Pat. No. 8,605,235.

(30) Foreign Application Priority Data

Nov. 27, 2009 (TW) ................................. 98140917 A (51) Int. Cl.
*G01B 11/14* (2006.01)
*G01B 11/24* (2006.01)
*G01B 11/02* (2006.01)
*G03F 7/20* (2006.01)
*G01B 11/08* (2006.01)

(52) U.S. Cl.
CPC ................ *G01B 11/24* (2013.01); *G01B 11/02* (2013.01); *G03F 7/70625* (2013.01); *G01B 11/08* (2013.01)

USPC .......... 356/625; 356/602; 349/106; 349/156; 349/139

(58) Field of Classification Search
CPC ........ G01B 11/24; G01B 11/02; G01B 11/14; G01B 11/08; G01B 11/105; G01B 11/046; G01B 11/00; G03F 7/70625; G01N 21/4788
USPC ........... 356/625, 635, 602; 349/106, 139, 156
See application file for complete search history.

(56) References Cited

U.S. PATENT DOCUMENTS

| | | | |
|---|---|---|---|
| 7,142,261 B2* | 11/2006 | Chiang et al. | 349/38 |
| 7,167,224 B1* | 1/2007 | Takeda et al. | 349/139 |
| 7,462,865 B2* | 12/2008 | Jung et al. | 257/59 |
| 8,077,286 B2* | 12/2011 | Takeda et al. | 349/156 |
| 2012/0154733 A1* | 6/2012 | Nakagawa et al. | 349/153 |

* cited by examiner

*Primary Examiner* — Tarifur Chowdhury
*Assistant Examiner* — Isiaka Akanbi
(74) *Attorney, Agent, or Firm* — Jianq Chyun IP Office (57) ABSTRACT

A method of measuring a surface structure of a display device is provided. The display device includes first and second substrates, first and second patterned light-shielding layers, and first and second pixel units. The first patterned light-shielding layer disposed on a surface of the first substrate includes first openings. The second patterned light-shielding layer disposed on the surface of the first substrate includes second openings. The first pixel unit includes first and second protrusions. The first protrusion correspondingly covers the first openings and a portion of the first patterned light-shielding layer. The second protrusion is disposed on and directly contacted with the first and second patterned light-shielding layers. The second pixel unit includes a third protrusion correspondingly covering the second openings and a portion of the second patterned light-shielding layer, wherein sizes of the second openings are smaller than sizes of the first openings.

10 Claims, 7 Drawing Sheets

METHOD OF MEASURING SURFACE STRUCTURE OF DISPLAY DEVICE

CROSS-REFERENCE TO RELATED APPLICATION

This application is a divisional application of U.S. application Ser. No. 12/779,915, filed on May 13, 2010, which claims the priority benefit of Taiwan application serial no. 98140917, filed on Nov. 27, 2009. The entirety of each of the above-mentioned patent applications is hereby incorporated by reference herein and made a part of specification.

BACKGROUND

1. Field of Invention

The invention is related to a method of measuring a surface structure of a display device, and is particularly related to a method of measuring a size of a surface structure of a display device, which is applying to the field of display device.

2. Description of Related Art

Recently, the trend of the display products is light, thin, small, and high resolution. However, these requirements cause difficulties in design, fabrication and size measurement of the internal structures of the display device. That is, in order to dispose more pixels in a smaller space to provide a higher resolution, the interval space between the structures is not sufficient. Therefore, the precision and the reproducibility of the size measurement results of the structures are poor. Furthermore, it is difficult to control the processes by adjusting the parameters according to the size measurement results, thus the production yield and the throughput are reduced.

Figure 1:
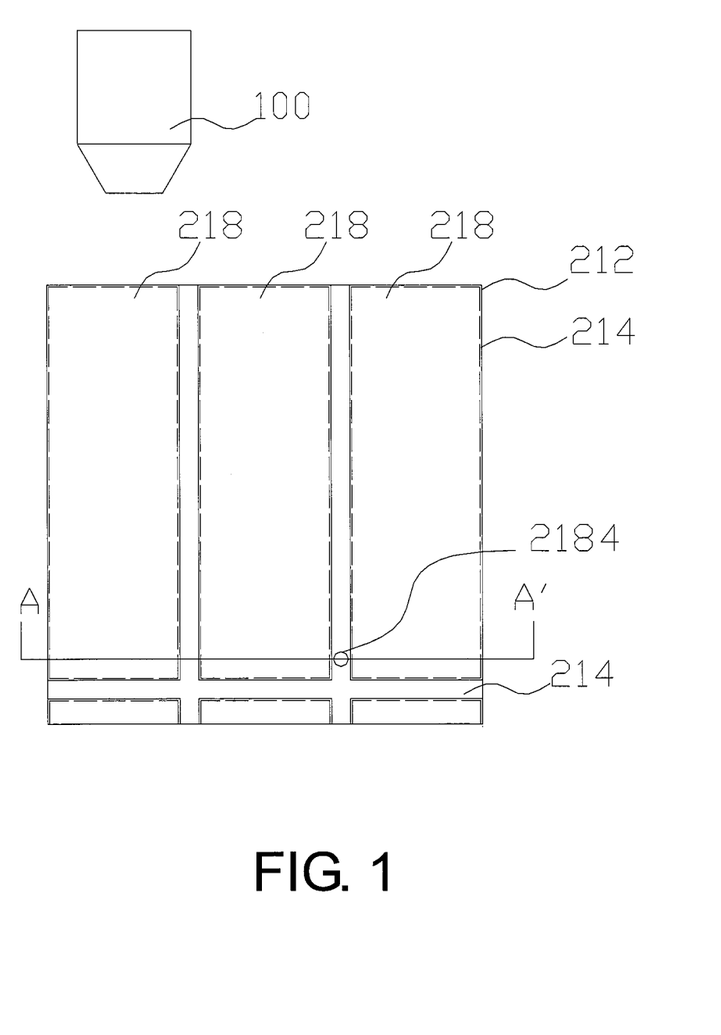
FIG. 1 is a schematic view of a display device and an optical measuring apparatus for a surface structure according to prior art.

FIG. 1 is a schematic view of a display device and an optical measuring apparatus for a surface structure. Referring to FIG. 1, the display device includes a first substrate 210, a patterned light-shielding layer 214, at least one first protrusion 218, and at least one second protrusions 2184. The first substrate 210 has a first surface 212. The patterned light-shielding layer 214 has a plurality of openings 216 and disposed on the first surface 212 of the first substrate 210. The first protrusion 218 correspondingly covers the openings 216 of the patterned light-shielding layer 214 and a portion of the patterned light-shielding layer 214. The second protrusions 2184 are disposed in the patterned light-shielding layer 214. The optical measuring apparatus for a surface structure (not shown) includes a positional movable platform (not shown), a light source (not shown), an operation processing unit (not shown), and a microscope lens 100, and the microscope lens 100 includes a dichroic mirror (not shown), a first light detector (not shown), and a second light detector (not shown).

Figure 2:
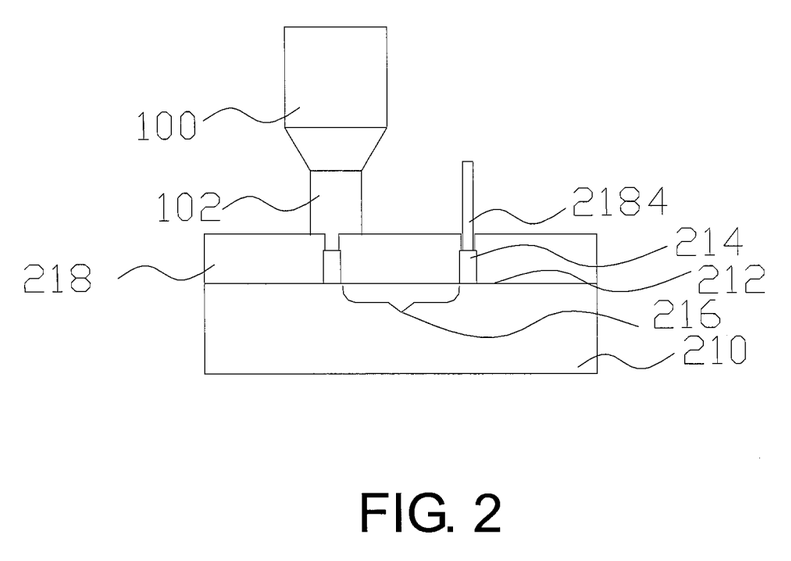
FIG. 2 is a schematic cross-sectional view of a height measurement of a patterned light-shielding layer of a display device according to prior art.

FIG. 2 is a schematic cross-sectional view of the optical measuring apparatus for a surface structure and the first substrate 210 of the display device along line A-A' in FIG. 1. Referring to FIG. 2, the positional movable platform carries the first substrate 210 of the tested display device to posit the microscope lens 100 directly over the patterned light-shielding layer 214 on the first substrate 210. The light source emits a parallel light beam 102 toward the patterned light-shielding layer 214, and the parallel light beam 102 is divided into a measuring light beam and an interference light beam by the dichroic mirror. The measuring light beam irradiates the patterned light-shielding layer 214 on the first substrate 210, a reflected light reflected from the patterned light-shielding layer 214 to the microscope lens 100 is received and converted into a first signal by the first light detector, and the interference light beam is received and converted into a second signal by the second light detector.

Figure 3:
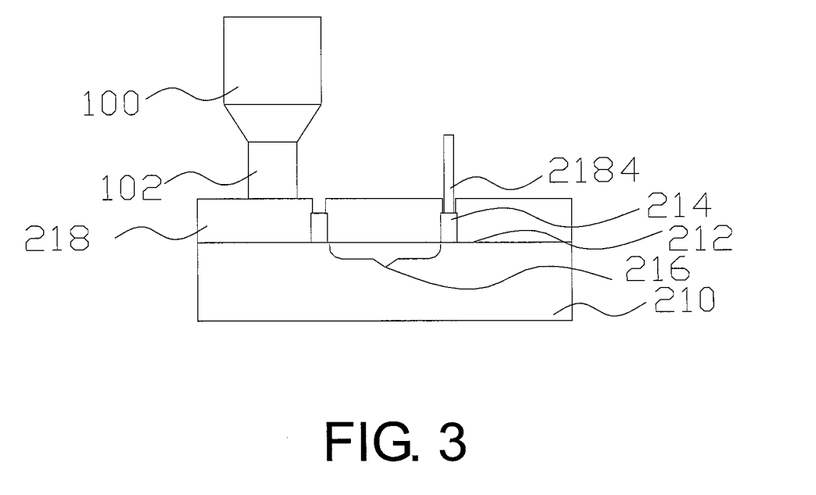
FIG. 3 is a schematic cross-sectional view of a height measurement of a first protrusion of a display device according to prior art.

FIG. 3 is a schematic cross-sectional view of the optical measuring apparatus for a surface structure and the first substrate 210 of the display device along line A-A' in FIG. 1. Referring to FIG. 3, the positional movable platform is moved to posit the microscope lens 100 directly over the first protrusion 218 on the first surface 212 of the first substrate 210. The light source emits a parallel light beam 102 toward the first protrusion 218, and the parallel light beam 102 is divided into a measuring light beam and an interference light beam by the dichroic mirror. The measuring light beam irradiates the first protrusion 218 of the first substrate 210, a reflected light reflected from the first protrusion 218 to the microscope lens 100 is received and converted into a third signal by the first light detector, and the interference light beam is received and converted into a fourth signal by the second light detector.

Figure 4:
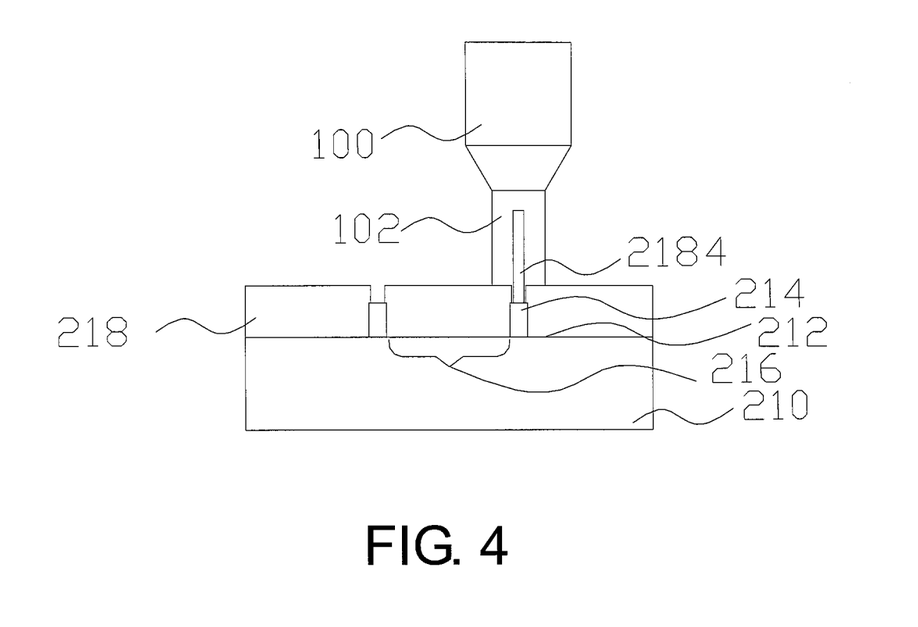
FIG. 4 is a schematic cross-sectional view of a height measurement of a second protrusion of a display device according to prior art.

FIG. 4 is a schematic cross-sectional view of the optical measuring apparatus for a surface structure and the first substrate 210 of the display device along line A-A' in FIG. 1. Referring to FIG. 4, the positional movable platform is further moved to posit the microscope lens 100 directly over the second protrusion 2184 on the first surface 212 of the first substrate 210. The light source emits a parallel light beam 102 toward the second protrusion 2184, and the parallel light beam 102 is divided into a measuring light beam and an interference light beam by the dichroic mirror. The measuring light beam irradiates the second protrusion 2184 of the first substrate 210, a reflected light reflected from the second protrusion 2184 to the microscope lens 100 is received and converted into a fifth signal by the first light detector, and the interference light beam is received and converted into a sixth signal by the second light detector. The first signal, the second signal, the third signal, the fourth signal, the fifth signal, and the sixth signal are received and operated by the operation processing unit to output the height of the first protrusion 218 and the height of the second protrusion 2184 on the first surface 212 of the first substrate 210.

However, in order to dispose more pixels in a smaller space to provide a higher resolution, a width of the light-shielding layer disposed between the pixels should be reduced. Therefore, the light-shielding layer can not provide a single plane having a sufficient width, and a uniform reflected light is not obtained as the measuring light beam irradiates the patterned light-shielding layer 214. Accordingly, the precision and the reproducibility of the size measurement results of the structures are poor. Furthermore, it is difficult to control the processes by adjusting the parameters according to the size measurement results, thus the production yield and the throughput are reduced.

SUMMARY OF THE INVENTION

An objective of the invention is to provide a method of measuring a surface structure of a display device. The method includes the following steps. A display device is provided. The display device includes a first substrate, a first patterned light-shielding layer, at least one second patterned light-shielding layer, at least one first pixel unit, at least one second pixel unit, and a second substrate. The first substrate has a first surface. The first patterned light-shielding layer includes a plurality of first openings and is disposed on the first surface of the first substrate. The second patterned light-shielding layer includes a plurality of second openings and is disposed on the first surface of the first substrate. The first pixel unit includes at least one first protrusion and at least one second protrusion. The first protrusion correspondingly covers the first openings of the first patterned light-shielding layer and a portion of the first patterned light-shielding layer. The second protrusion is disposed on and directly contacted with the first patterned light-shielding layer and the second patterned light-shielding layer. The second pixel unit includes at least one third protrusion. The third protrusion correspondingly covers the second openings of the second patterned light-shielding layer and a portion of the second patterned light-shielding layer, wherein sizes of the second openings of the second patterned light-shielding layer are smaller than sizes of the first openings of the first patterned light-shielding layer, and a length in between two of the adjacent first openings of the first bar-shaped light-shielding pattern is smaller than a length in between two of the adjacent second openings of the second bar-shaped light-shielding pattern. The second substrate has a second surface and is disposed opposite to the first surface of the first substrate. An optical measuring apparatus for a structure is provided. The optical measuring apparatus includes a positional movable platform, a light source, an operation processing unit, and a microscope lens, and the microscope lens includes a dichroic mirror, a first light detector, and a second light detector. The positional movable platform is used to move the microscope lens or the substrate of the tested display device to align the microscope lens with the second patterned light-shielding layer on the substrate of the tested display device. The second patterned light-shielding layer is used as a reference plane and the light source provides a parallel light beam passing through the dichroic mirror of the microscope lens. The parallel light beam is divided into a measuring light beam and an interference light beam by the dichroic mirror. The measuring light beam irradiates the tested structure on the substrate of the display device or the reference plane and is reflected to the microscope lens. Then, the reflected light is received and converted into a reflected light signal by the first light detector, and the interference light beam is received and converted into an interference light signal by the second light detector. The steps described above are repeated to sequentially measure the first protrusion, the second protrusion, and the third protrusion on the substrate of the tested display device. Accordingly, a paired reflected light signal and interference light signal are obtained, respectively. Thereafter, the reflected light signals and the interference light signals are received and operated by the operation processing unit to output the height of the first protrusion, the second protrusion and the third protrusion, respectively.

In the invention, the second patterned light-shielding layer provides a larger reflector plane than the first patterned light-shielding layer. Therefore, the measurement result of the height of the second patterned light-shielding layer is more precise and more reproducible than the measurement result of the height of the first patterned light-shielding layer, and picture quality and brightness of the display device are not significantly affected. Accordingly, a relative height of a photo spacer calculated according to the measurement result of the height of the second patterned light-shielding layer is more precise and more reproducible. Furthermore, more precise data is provided to control the processes which are adjusted by the parameters according to the size measurement results, thus the production yield and the throughput are increased.

In order to make the aforementioned and other features and advantages of the present invention more comprehensible, several embodiments accompanied with figures are described in detail below.

DESCRIPTION OF EMBODIMENTS

First Embodiment

Figure 5:
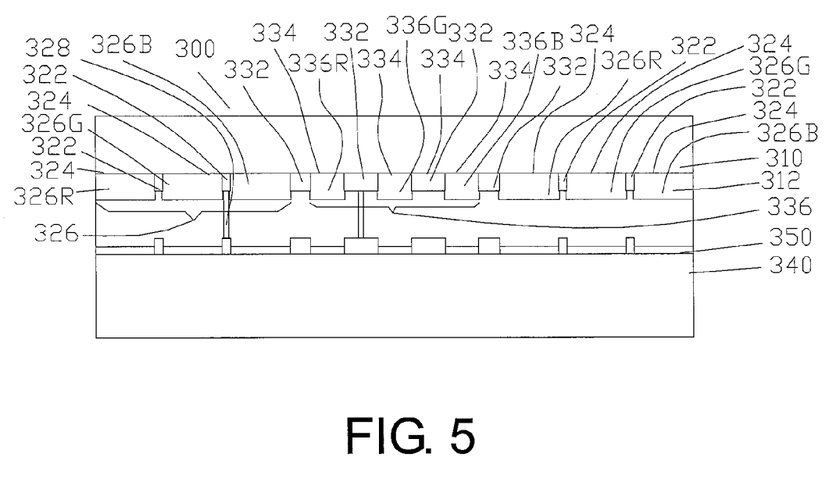
FIG. 5 is a schematic cross-sectional view of a display device according to a first embodiment of the invention.

FIG. 5 is a schematic cross-sectional view of a display device according to a first embodiment of the invention. Referring to FIG. 5, a display device 300 of an embodiment of the invention is, for example, a liquid crystal display device, and includes a first substrate 310, a first patterned light-shielding layer 322, at least one second patterned light-shielding layer 332, at least one first pixel unit 326, at least one second pixel unit 336, and a second substrate 340. The first substrate 310 has a first surface 312. The first patterned light-shielding layer 322 includes a plurality of first openings 324 and is disposed on the first surface 312 of the first substrate 310. The second patterned light-shielding layer 332 includes a plurality of second openings 334 and is disposed on the first surface 312 of the first substrate 310 in the first patterned light-shielding layer 322. The first pixel unit 326 includes at least one first red color filter layer 326R, at least one first blue color filter layer 326B, and at least one first green color filter layer 326G which cover the first openings 324 of the first patterned light-shielding layer 322 and a portion of the first patterned light-shielding layer 322, respectively. The first pixel unit 326 further includes at least one photo spacer 328 disposed in the first patterned light-shielding layer 322 and the second patterned light-shielding layer 332. The second pixel unit 336 includes at least one second red color filter layer 336R, at least one second blue color filter layer 336B, and at least one second green color filter layer 336G which cover the second openings 334 of the second patterned light-shielding layer 332 and a portion of the second patterned light-shielding layer 332, respectively, wherein sizes of the second openings 334 of the second patterned light-shielding layer 332 are smaller than sizes of the first openings 324 of the first patterned light-shielding layer 322. The second substrate 340 has a second surface 350 and is disposed opposite to the first surface 312 of the first substrate 310.

In the invention, the second patterned light-shielding layer 332 provides a larger reflector plane than the first patterned light-shielding layer 322. Therefore, the measurement result of the height of the second patterned light-shielding layer 332 is more precise and more reproducible than that of the first patterned light-shielding layer 322. Accordingly, a relative height of the photo spacer 328 calculated according to the measurement result of the second patterned light-shielding layer 332 is more precise and more reproducible, and picture quality and brightness of the display device are not significantly affected.

Second Embodiment

Figure 6:
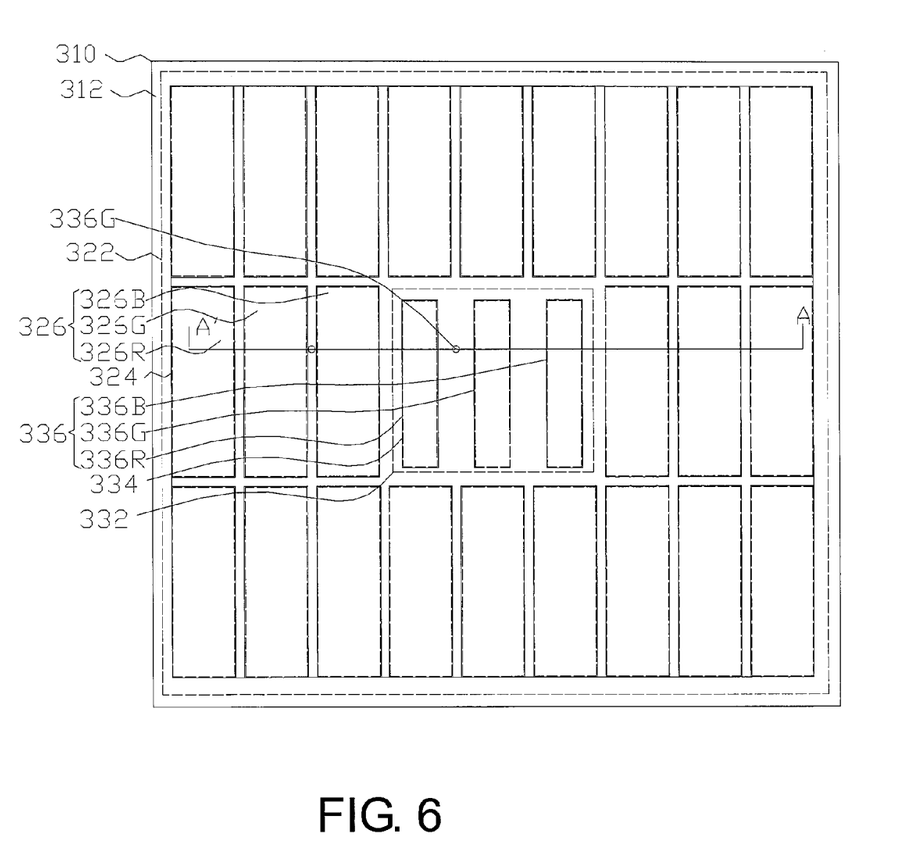
FIG. 6 is a plane view of the first substrate 310 in FIG. 5 according to a second embodiment of the invention.

FIG. 6 is a plane view of the first substrate 310 in FIG. 5 according to a second embodiment of the invention. Referring to FIGS. 5 and 6, a method of measuring a surface structure of a display device according to the second embodiment of the invention includes the following steps. First, a display device 300 is provided. The display device 300 is, for example, a liquid crystal display device, and includes a first substrate 310, a first patterned light-shielding layer 322, at least one second patterned light-shielding layer 332, at least one first pixel unit 326, at least one second pixel unit 336, and a second substrate 340. The first substrate 310 has a first surface 312. The first patterned light-shielding layer 322 includes a plurality of first openings 324 and is disposed on the first surface 312 of the first substrate 310. The second patterned light-shielding layer 332 includes a plurality of second openings 334 and is disposed on the first surface 312 of the first substrate 310 in the first patterned light-shielding layer 322. The first pixel unit 326 includes at least one first red color filter layer 326R, at least one first blue color filter layer 326B, and at least one first green color filter layer 326G which cover the first openings 324 of the first patterned light-shielding layer 322 and a portion of the first patterned light-shielding layer 322, respectively. The first pixel unit 326 further includes at least one photo spacer 328 disposed in the first patterned light-shielding layer 322 and the second patterned light-shielding layer 332. The second pixel unit 336 includes at least one second red color filter layer 336R, at least one second blue color filter layer 336B, and at least one second green color filter layer 336G which cover the second openings 334 of the second patterned light-shielding layer 332 and a portion of the second patterned light-shielding layer 332, respectively, wherein sizes of the second openings 334 of the second patterned light-shielding layer 332 are smaller than sizes of the first openings 324 of the first patterned light-shielding layer 322. The second substrate 340 has a second surface 350 and is disposed opposite to the first surface 312 of the first substrate 310.

Then, an optical measuring apparatus for a structure (not shown) is provided . . . . Thereafter, the first reflected and interference light signals and the second reflected and interference light signals are received and operated by the operation processing unit to output the height of the red color filter layer 336R of the second pixel unit 336 (referring to the height difference H1 between the second patterned light-shielding layer 332 and the red color filter layer 336R in FIG. 7). The first reflected and interference light signals and the third reflected and interference light signals are received and operated by the operation processing unit to output the height of the photo spacer 328 (referring to the height difference H2 between the second patterned light-shielding layer 332 and the photo spacer 328 in FIG. 7). Then, a subtraction procedure is performed to subtract the height of the second red color filter layer 336R (referring to height difference H2) from the height of the photo spacer 328 (referring to height difference H1) by the operation processing unit and a relative height H3 of the photo spacer 328 is output.

Figure 7:
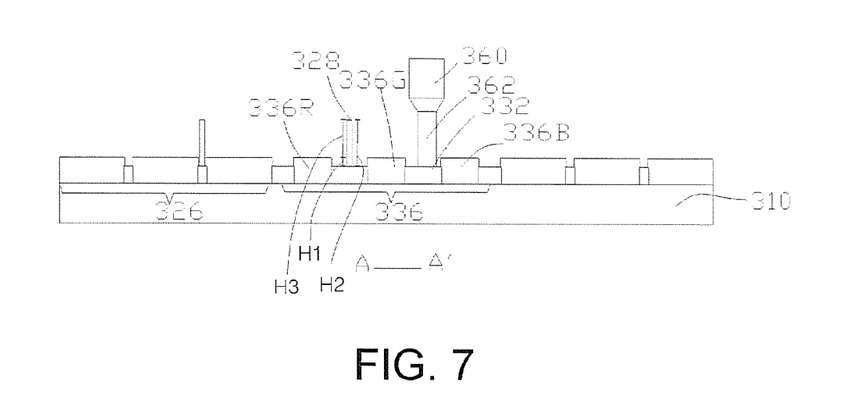
FIG. 7 is a schematic view of a height measurement according to the second embodiment of the invention.

In the invention, the second patterned light-shielding layer 332 provides a larger reflector plane than the first patterned light-shielding layer 322. Therefore, the measurement result of the height of the second patterned light-shielding layer 332 is more precise and more reproducible than the measurement result of the height of the first patterned light-shielding layer 322. Accordingly, the relative height of the photo spacer 328 calculated according to the measurement result of the second patterned light-shielding layer 332 is more precise and more reproducible, and picture quality and brightness of the display device are not significantly affected.

In summary, the invention has the following advantages.

First, a larger light-shielding layer is disposed in part of the display screen to provide a sufficient measuring plane, and a low process yield due to the difficulty in the measurement of the surface structure of the display device with a high resolution is improved.

Second, since a larger light-shielding layer is disposed in part of the display screen, picture quality and brightness of the display device are not significantly affected.

Third, a reliable and effective method of measuring a surface structure of a display device is established.

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A method of measuring a surface structure of a display device, comprising:
    providing a display device, the display device comprising:
        a first substrate, having a first surface;
        a first patterned light-shielding layer, having a plurality of first openings and disposed on the first surface of the first substrate;
        at least one second patterned light-shielding layer, having a plurality of second openings and disposed on the first surface of the first substrate;
        at least one first pixel unit, comprising:
            at least one first protrusion, correspondingly covering the first openings of the first patterned light-shielding layer; and
            at least one second protrusion, disposed on and directly contacted with the first patterned light-shielding layer and the second patterned light-shielding layer;
        at least one second pixel unit, comprising:
            at least one third protrusion, correspondingly covering the second openings of the second patterned light-shielding layer, wherein sizes of the second openings of the second patterned light-shielding layer are smaller than sizes of the first openings of the first patterned light-shielding layer, and a length in between two of the adjacent first openings of the first bar-shaped light-shielding pattern is smaller than a length in between two of the adjacent second openings of the second bar-shaped light-shielding pattern; and
        a second substrate, having a second surface and disposed opposite to the first surface of the first substrate;
    providing a measuring apparatus;
    measuring a first height of the first protrusion covering a surface of the second patterned light-shielding layer, the first height being a height difference between the second patterned light-shielding layer and the first protrusion;
    measuring a second height of the second protrusion covering a surface of the second patterned light-shielding layer, the second height being a height difference between the second patterned light-shielding layer and the second protrusion; and
    calculating a third height which is a difference between the first height and the second height.

2. The method of measuring a surface structure of a display device as claimed in claim 1, wherein the first protrusion comprises at least one red color filter layer, at least one blue color filter layer, and at least one green color filter layer.

3. The method of measuring a surface structure of a display device as claimed in claim 1, wherein the second protrusion comprises at least one photo spacer.

4. The method of measuring a surface structure of a display device as claimed in claim 1, wherein the third protrusion comprises at least one red color filter layer, at least one blue color filter layer, and at least one green color filter layer.

5. The method of measuring a surface structure of a display device as claimed in claim 1, wherein the display device is a liquid crystal display device.

6. The method of measuring a surface structure of a display device as claimed in claim 1, wherein the display device is an electrophoretic display device.

7. The method of measuring a surface structure of a display device as claimed in claim 1, wherein the measuring apparatus is a surface-contact measuring apparatus.

8. The method of measuring a surface structure of a display device as claimed in claim 1, wherein the measuring apparatus is an optical non-contact measuring apparatus.

9. The method of measuring a surface structure of a display device as claimed in claim 1, wherein the measuring apparatus is an ultrasonic non-contact measuring apparatus.

10. The method of measuring a surface structure of a display device as claimed in claim 1, wherein the measuring apparatus is a sonic non-contact measuring apparatus.

* * * * *